(12) United States Patent
Chan et al.

(10) Patent No.: US 7,713,767 B2
(45) Date of Patent: May 11, 2010

(54) METHOD OF MAKING CIRCUITIZED SUBSTRATE WITH INTERNAL OPTICAL PATHWAY USING PHOTOLITHOGRAPHY

(75) Inventors: Benson Chan, Vestal, NY (US); How T. Lin, Vestal, NY (US); Roy H. Magnuson, Endicott, NY (US); Voya R. Markovich, Endwell, NY (US); Mark D. Poliks, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 274 days.

(21) Appl. No.: 11/907,004

(22) Filed: Oct. 9, 2007

(65) Prior Publication Data

US 2009/0093073 A1 Apr. 9, 2009

(51) Int. Cl.
*H01L 21/77* (2006.01)
*H01L 21/00* (2006.01)
*G02B 6/02* (2006.01)
*G02B 6/12* (2006.01)
*G03G 15/00* (2006.01)

(52) U.S. Cl. .............................. 438/24; 438/29; 438/31; 427/163.2; 427/466; 427/468; 427/470; 427/162; 430/57.1; 430/60; 430/62; 385/14; 385/129; 385/130; 385/131; 385/141; 257/E21.598

(58) Field of Classification Search .................. 385/14, 385/129, 130, 131, 132, 141, 15, 143, 145, 385/52; 438/29, 31, 24; 430/56, 57.1, 60, 430/66, 62; 427/465, 467, 466, 470, 485, 427/162, 163.2, 164, 468; 257/E21.598
See application file for complete search history.

(56) References Cited

U.S. PATENT DOCUMENTS

| 5,263,111 | A | * | 11/1993 | Nurse et al. | .................. 385/130 |
| 6,690,845 | B1 | * | 2/2004 | Yoshimura et al. | ............ 385/14 |
| 6,996,305 | B2 | | 2/2006 | Kim et al. | ...................... 385/15 |
| 7,045,897 | B2 | | 5/2006 | Egitto et al. | ................ 257/759 |
| 7,136,551 | B2 | | 11/2006 | Cho et al. | ...................... 385/31 |
| 7,149,376 | B2 | | 12/2006 | Uchida et al. | .................. 385/15 |

(Continued)

FOREIGN PATENT DOCUMENTS

JP 2000-121859 4/2000 ............... 385/14 X

*Primary Examiner*—Brian M Healy
(74) *Attorney, Agent, or Firm*—Mark Levy; Lawrence R. Fraley; Hinman, Howard & Kattell

(57) ABSTRACT

A method of making a circuitized substrate (e.g., PCB) including at least one and possibly several internal optical pathways as part thereof such that the resulting substrate will be capable of transmitting and/or receiving both electrical and optical signals. The method involves forming at least one opening between a side of the optical core and an adjacent upstanding member such that the opening is defined by at least one angular sidewall. Light passing through the optical core material (or into the core from above) is reflected off this angular sidewall. The medium (e.g., air) within the opening thus also serves as a reflecting medium due to its own reflective index in comparison to that of the adjacent optical core material. The method utilizes many processes used in conventional PCB manufacturing, thereby keeping costs to a minimum. The formed substrate is capable of being both optically and electrically coupled to one or more other substrates possessing similar capabilities, thereby forming an electro-optical assembly of such substrates.

13 Claims, 6 Drawing Sheets

U.S. PATENT DOCUMENTS

| | | | |
|---|---|---|---|
| 7,149,389 B2 | 12/2006 | Yoon et al. | 385/43 |
| 7,212,713 B2 | 5/2007 | Fukuzawa | 385/50 |
| 7,223,023 B2 | 5/2007 | Killer et al. | 385/88 |
| 7,224,857 B2 | 5/2007 | Liu et al. | 385/14 |
| 7,228,020 B2 | 5/2007 | Weigert | 385/14 |
| 7,248,771 B2 * | 7/2007 | Schmidt et al. | 385/129 |
| 7,541,058 B2 * | 6/2009 | Chan et al. | 427/163.2 |
| 2002/0039464 A1 * | 4/2002 | Yoshimura et al. | 385/14 |
| 2006/0210213 A1 | 9/2006 | Huang et al. | 385/14 |
| 2009/0093073 A1 * | 4/2009 | Chan et al. | 438/24 |

* cited by examiner

METHOD OF MAKING CIRCUITIZED SUBSTRATE WITH INTERNAL OPTICAL PATHWAY USING PHOTOLITHOGRAPHY

TECHNICAL FIELD

This invention relates to circuitized substrates (e.g., printed circuit boards and chip carriers) and particularly to circuitized substrates having means to provide optical transmissions as part thereof.

CROSS REFERENCE TO CO-PENDING APPLICATION

In Ser. No. 11/907,006, entitled "Method of Making Circuitized Substrate With Internal Optical Pathway", there is defined a method of making a circuitized substrate (e.g., PCB) including at least one and possibly several internal optical pathways as part thereof such that the resulting substrate will be capable of transmitting and/or receiving both electrical and optical signals. The method involves forming at least one opening between a side of the optical core and an adjacent upstanding member such that the opening is defined by at least one angular sidewall. Light passing through the optical core material (or into the core from above) is reflected off this angular sidewall. The medium (e.g., air) within the opening thus also serves as a reflecting medium due to its own reflective index in comparison to that of the adjacent optical core material. The method utilizes many processes used in conventional PCB manufacturing, thereby keeping costs to a minimum. The formed substrate is capable of being both optically and electrically coupled to one or more other substrates possessing similar capabilities, thereby forming an electro-optical assembly of such substrates.

BACKGROUND OF THE INVENTION

Responsive to increases in data transmission and data processing rates brought about by broadband communications and interactive telecommunication and computer services, there is a need for increased interconnection density and capacity in electronic equipment, and particularly in circuitized substrates which form part of such equipment. This need has led to a growing reliance upon optical means such as optical fibers as a replacement for traditional wire (e.g., copper) transmission lines. In some situations involving long distance transmissions, such a demand has resulted in the almost complete replacement of copper wire with optical fiber. The advantages of doing so include lower transmission losses and superior bandwidth characteristics. Optical transmission can also improve system performance if applied at short distances, for example, such as between physically adjacent equipment racks and cabinets, or between offices in a given building. However, the benefits of optical fiber transmission extend to even shorter distances, as at intra-board level among integrated circuits and other components on a single circuitized substrate (e.g., circuit board). This also applies at the intra-module level for interconnecting such components as very large scale (VLSI) and ultra large scale (ULSI) integrated circuits and chip subassemblies in a single electronic module. Use of such optical connections is also considered advantageous because such close (and more distant) transmissions are able to do so at gigabyte speeds. Additional advantages of optical interconnections over electrical conductors at the substrate and module level include immunity to electromagnetic interference (EMI) or electrical noise, electrical isolation of interconnected components, far less frequency dependent signal degradation, and higher possible density of necessary interconnects due to lack of cross-talk between closely spaced, fine conductors.

Additional examples of efforts to provide optical interconnections at the circuitized substrate level are illustrated in optical flex technology marketed by Advanced Interconnection Technology, LLC of Islip, N.Y. and the optical flex foil approach which is part of the Apollo Demonstrator project at the Micro Interconnect Research Center of L M Ericsson, Stockholm, Sweden (described in Ericsson review, No. 2, 1995, vol. 72). In general, these optical interconnections involve arranging lengths of optical fibers in a desired pattern customized to the intended application, laminating the optical fibers between sheets of a flexible foil and applying appropriate connectors and terminations to the fiber ends. The lamination holds both the fibers and the connectors in the desired layout. The flex foil is then assembled to a conventional rigid circuit board simply by plugging the connectors to corresponding mating connectors on the circuit board. Mechanical supports may be provided on the circuit board for stabilizing the flex foil in place rather than relying on the fiber connectors alone for this purpose. The flex foil is typically supported in spaced relationship above the electrical components on the board. It has also been suggested that the flex foil be laminated or bonded to a rigid circuit board to thereby integrate optical and electrical interconnects.

It is understood that the above two examples and those represented in the patents listed below are not an exhaustive summary of those possibly available in the field. Further, the listing of these documents is not an admission that any are prior art to the present invention.

In U.S. Pat. No. 6,996,305, there is described a printed circuit board (hereinafter also referred to simply as a PCB) with opto-via holes for transmitting an optical signal to an optical waveguide in the PCB, and a process of forming the opto-via holes. The process comprises forming a plurality of via holes on a plurality of copper-clad laminates using a drill, plating an inner wall of each via hole, exposing and etching the plated portions of an upper and lower side of each copper clad laminate to form a circuit pattern on the upper and lower side of the copper clad laminate, layering the patterned copper clad laminates on each other using an insulating resin adhesive, and removing the insulating resin adhesive in the predetermined via holes to form opto-via holes. According to the authors, the process is advantageous because the optical signal is stably transmitted to the optical waveguide in the PCB without damaging the optical waveguide directly exposed to an external environment, and the optical waveguide suitable to physical properties of the material constituting the PCB is easily inserted between the inner layer and the outer layer.

In U.S. Pat. No. 7,045,897, there is described an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof.

In U.S. Pat. No. 7,136,551, there is described an optical printed circuit board (PCB) having a multi-channel optical waveguide, which comprises an optical waveguide having an optical path for transmitting light beams, a groove for penetrating the optical waveguide and an optical interconnection block inserted in the groove and connected to the optical waveguide to transmit the light beams, wherein the optical interconnection block includes an optical fiber bundle bent by the angle of 90 degrees. The optical interconnection block connects a plurality of multi-layered optical waveguides to transmit light beams to the optical waveguides. The optical fiber bundle is installed as a medium of the multi-channel optical waveguide in the optical PCB.

In U.S. Pat. No. 7,149,376, there is described a circuit board with embedded optical fibers terminating in fiber ends which face into holes defined in the circuit board and optoelectronic emitter or detector modules mounted in the holes in optical coupling with the fiber ends. Each module is electrically connected to circuit traces on the circuit board and is optically coupled to one or more optical fibers terminating on a side surface of the hole. The modules have an optical axis oriented into the hole and a reflector supported in the hole for optically coupling the photo emitter/detector module with the fiber ends on the side surface of the hole.

In U.S. Pat. No. 7,149,389, there is described an optical printed circuit board system having a tapered optical waveguide. The system includes a substrate as a printed circuit board having an electrical circuit and on which an electrical circuit chip is mounted, a system board including an optical bench coupled to the substrate and on which a photoelectrical signal chip electrically connected to the electrical circuit chip through the electrical circuit, an optical device electrically connected to the photoelectrical signal chip, and a first optical waveguide aligned to the optical device for optical coupling. The waveguide is tapered to have a smaller aperture in an output node for outputting the optical signals smaller than that in an input node for inputting the optical signals. The system further includes a back plane including a groove into which the system board is inserted and a second optical waveguide optically coupled to the first optical waveguide and tapered to have a smaller aperture in the output node than in the input node. The input node of the first optical waveguide is optically coupled to the output node of the second optical waveguide or the output node of the first optical waveguide is optically coupled to the input node of the second optical waveguide.

In U.S. Pat. No. 7,212,713, there is described an optical transmission substrate including: a first substrate; an optical waveguide which has clad covering a core and a periphery of the core and extends on an upper surface of the first substrate; a second substrate provided parallel to the first substrate so that a lower surface thereof contacts an upper surface of the optical waveguide; a reflection surface which is provided on a cross section of the core at an end of the optical waveguide and reflects light, which travels through the core of the optical waveguide, toward the second substrate; and a light guide which is provided in the second substrate and guides the light, which is reflected toward the second substrate, toward an upper surface of the second substrate from a position closer to the core than an upper surface of the clad.

In U.S. Pat. No. 7,223,023, there are described optoelectronic transmission and/or reception arrangements having a surface-mounted optoelectronic component and a circuit board provided with electrical lines, the optoelectronic component being surface-mounted on the circuit board, the optical axis of the optoelectronic component running perpendicular to the plane of the circuit board. In one embodiment, provision is made of a holding apparatus for receiving and orienting an optical waveguide to be coupled to the optoelectronic component, which holding apparatus directly adjoins the side of the optoelectronic component that is remote from the circuit board. In another embodiment, the circuit board has a cutout and light is coupled into or out of the optoelectronic component in the direction of the cutout of the circuit board.

In U.S. Pat. No. 7,224,857, there is described an optical-routing board for an opto-electrical system having optical waveguides embedded in non-laminated optical substrates that enable optical signals to be routed among opto-electric components mounted on the top surfaces of the optical substrates. Methods for making the optical-routing boards are also disclosed. The waveguides are formed by focused pulse-laser writing, with the focal point of the pulsed-laser beam being moved in a three-dimensional manner through the non-laminated substrate. Bevel surfaces are preferably formed in the substrate to facilitate bending of the waveguides.

In U.S. Pat. No. 7,228,020, there is described an optoelectronic arrangement having a surface-mountable semiconductor module having at least one optoelectronic transmitting and/or receiving unit, a housing, in which the optoelectronic transmitting and/or receiving unit is arranged, and a mounting side of the housing, which, in the case of surface mounting of the semiconductor module on a printed circuit board, faces the printed circuit board. The arrangement furthermore has a cooling element, which is thermally coupled to the semiconductor module for the purpose of cooling the optoelectronic transmitting and/or receiving unit. The cooling element is arranged on a side of the housing that is remote from the mounting side.

In U.S. Publication 2006/0210213, there is described an optical backplane providing integrated optical couplers for coupling to external optical fibers, along with a method for making the same. One optical backplane has a first cladding layer disposed over the top surface of a substrate, and at least a first core body disposed over the first cladding layer, with the first core body having a first end and a second end. A material layer is disposed above the first cladding layer and the first end of the first core body, with the material layer having a top surface and a bottom surface. A focusing element is formed at the top surface of the material layer, with the focusing element being located above the first end of the first core body.

In Japanese Patent Application Publication No. 2000-121859, there is described a method of manufacturing an embedded type optical waveguide device. This method involves manufacturing an optical waveguide device by (1) depositing an "undercladding" layer over a silica glass substrate, (2) forming a mask over the undercladding layer, (3) using this mask to form a groove for accommodating a core, (4) depositing a core layer over the undercladding layer, (5) forming a core by leaving the core layer inside the groove and removing other portion of the core layer on the undercladding layer by chemical-mechanical polishing, and (6) forming an "overcladding" layer over the core and the undercladding layer.

As defined herein, the present invention defines the formation of a circuitized substrate during which at least one (and possibly several) optical pathways are formed which are capable of having optical signals pass there-through and eventually exit the substrate, e.g., to be coupled to an external optoelectronic component such as a transmitter-receiver device. The method used to accomplish this formation utilizes many conventional processes used in producing printed circuit boards and is thus able to provide an effective and cost-reduced process compared to processes such as those described above. It is believed that such a method would constitute a significant advancement in the art.

OBJECTS AND SUMMARY OF THE INVENTION

It is, therefore, a primary object of the invention to enhance the circuitized substrate art and particularly that aspect of the art involving the use of internal optical pathways for such substrates.

It is another object of the invention to provide a new and unique method of making a circuitized substrate which enables utilization of some conventional printed circuit board processes to thus assure a relatively cost-effective method and resulting product.

It is yet another object of the invention to provide such a method which may be implemented to produce a wide range of circuitized substrate products, including of large and small sizes, thus making the final products usable in a wide variety of end products.

According to one embodiment of the invention, there is defined a method of making a circuitized substrate including at least one optical pathway therein, the method comprising the steps of providing a first dielectric layer, providing a first cladding layer on the first dielectric layer, providing a first electrically conductive layer on the first cladding layer, patterning the first electrically conductive layer to define at least one upstanding member, providing an optical core on the first cladding layer having at least one end portion contiguous the upstanding member, removing a portion of this optical core adjacent the upstanding member to define a first opening within the core having an angular sidewall, providing a second cladding layer over the optical core, the first opening and the upstanding member, providing at least one covering layer over the second cladding layer to form a circuitized substrate and forming at least one second opening within this covering layer and said second cladding layer relative to the angular sidewall such that optical signals passing through the core will be reflected off this angular sidewall and pass through the second opening.

BEST MODE FOR CARRYING OUT THE INVENTION

Figure 1:
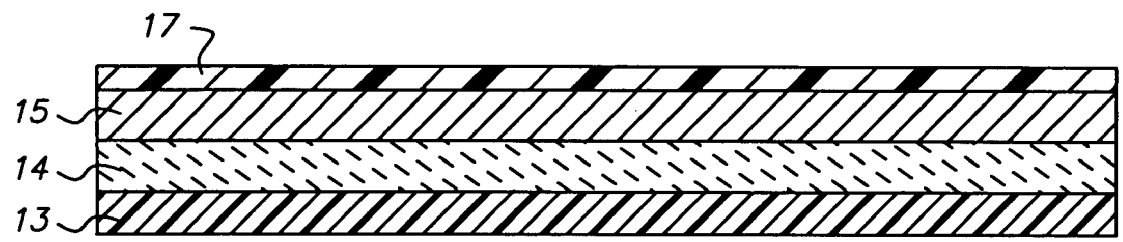
FIGS. 1-11 represent the initial steps of forming a circuitized substrate according to one embodiment of the invention, these steps being common to at least two separate and subsequent series of steps designed to produce a completed substrate product.

For a better understanding of the present invention, together with other and further objects, advantages and capabilities thereof, reference is made to the following disclosure and appended claims in connection with the above-described drawings. Like numerals will be used to identify like elements from FIG. 1 to FIG. 18.

By the term "circuitized substrate" as used herein is meant to include multilayered structures having a plurality of dielectric layers and a plurality of electrically conductive layers, typically arranged in an alternating manner, capable of operating to conduct electrical signals there-through. The term "circuitized substrate" as used herein is also meant to include at least one internal optical pathway capable of having optical signals pass there-through. Examples of dielectric materials usable for the dielectric layers include fiberglass-reinforced epoxy resins (sometimes referred to as "FR4" dielectric material in the art), polytetrafluoroethylene (e.g., Teflon), polyimides, polyamides, cyanate resins, photo-imageable materials, and other like materials. The conductive layers for such substrates are metal and may function in various conductive capacities (e.g., as power, signal and/or ground planes) in the final product. Examples of metals for such layers include copper and copper alloys, but may include additional metals (e.g., nickel, aluminum, etc.) or alloys thereof. It is believed that the teachings of the instant invention are also applicable to what are known as "flex" circuits (which use dielectric materials such as polyimide), in addition to the more widely known and more rigid printed circuit boards and chip carriers as sold today.

By the term "optical pathway" or "core" as used herein is meant a defined path of optically transmissible material, including a path of rectangular, circular, or other cross-sectional configuration, which is capable of having optical data-carrying signals pass there-through. One example of such a material is pure silica glass, and others are known in the art. The optical signals passing through this material may be provided from a conventional source such as an optoelectronic transmitter/receiver module (e.g., one having a laser as a light source) or the like, many of which are known in the art. Such a pathway is thus capable of providing an optical connection between two such components such that said components may communicate, optically, between each other.

By the term "cladding layer" as used herein is meant a layer of material capable of being successfully bonded (clad) to an optical core and which includes a refractive index less than that of the core. Such materials are known in the art. One example is silicon oxide base material with a dopant added to increase the refractive index. Examples of known dopants include fluorine and boron, with the doping possibly occurring using what is known as a plasma CVD process. Other doping processes are also known in the art.

FIGS. 1-11 illustrate the initial, common steps of making a circuitized substrate having at least one internal optical pathway (and preferably several) according to one embodiment of this invention. As stated, these steps may precede at least two different series of follow-on steps to form the product taught herein, these subsequent series shown in FIGS. 12-14 and FIGS. 15-18, respectively. It is understood that the invention is not limited to the particular sequence of these steps nor to the specific processes defined for implementing same, unless otherwise stated. The views shown are in cross-section, on an enlarged scale and are only partially presented. Therefore, it is understood that the structures shown may have wider and/or thicker dimensions than those shown, and may include additional features (e.g., signal pads and/or lines, conductive thru-holes, etc.). Two examples of the circuitized substrates made using these methods are shown in FIGS. 14 and 18, respectively, and include only two patterned conductive members with adjacent optical core material portions each including angular sidewalls designed for providing angular reflection from light signals (data) passing through the optical pathways adjacent thereto or into same. It is understood, however, that several additional such patterned conductive members, reflecting sidewalls, and pathways may be produced using the unique teachings herein. The invention is thus not limited to formation of a circuitized substrate with only the number of those shown.

In FIG. 1, a first dielectric layer 13 (e.g., of the aforementioned "FR4" material) is provided and includes a thickness of from about one mil (a mil understood to be 1/1000 of an inch) to thirty mils. On layer 13 is formed a first cladding layer 14 which is preferably provided on layer 13 using a known coating process, such as slot coating. Cladding layer 14 may be of one of the materials listed above (including the addition of one or more dopants), or, alternatively, comprised of various "optically" transparent optical waveguide polymer material, and in one embodiment, may possess a refractive index (which is understood to mean the ratio of the speed of light in vacuum, air or other medium of reference, compared to the speed of light in a given medium) of about 1.40. Layer 14 may have a thickness of from about forty mils to about eighty mils. On cladding layer 14 is formed a first electrically conductive layer 15, preferably of copper or copper alloy. Layer 15 may be provided in sheet form and bonded to layer 14 using conventional PCB lamination processing at a pressure of from about 300 pounds per square inch (PSI) to about 500 PSI, at a temperature of from about 170 degrees Celsius (C.) to about 210 degrees C., for a time period of about ninety minutes to 120 minutes. Such lamination for PCBs typically involves the alignment of desired layers (usually in alternating fashion, e.g., dielectric-conductive-dielectric, etc.) and the application of significant pressure onto this "stack" at elevated temperatures for a predetermined time period. Such processing, as stated, is conventionally known and more detailed definition is not considered necessary. In one embodiment, layer 15 may have a thickness of from 0.7 mils to five mils. It is possible using the teachings herein to laminate all three layers 13, 14 and 15 simultaneously, or, alternatively, laminate layers 13 and 14, and then laminate layer 15 onto this two layered sub-composite structure.

Atop the layered sub-composite in FIG. 1 is bonded a layer of photo-resist (also referred to here simply as resist) 17, preferably also using conventional PCB lamination, e.g., at a pressure of from about one pound per square inch (PSI) to about twenty-five PSI, at a temperature of from about twenty-five degrees Celsius (C.) to about forty-five degrees C., for a time period of about one minute to about three minutes. Resist 17 may have a thickness of only about one mil to about 2.5 mils and is added in FIG. 1 as one of the initial steps to patterning the underlying conductive layer 15, a significant process of this invention.

Figure 2:
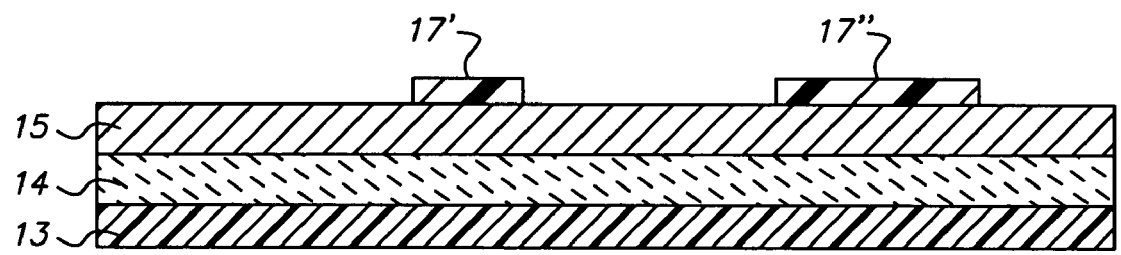

In FIG. 2, photo-resist layer 17 is itself patterned, using a master (not shown) and exposure processing typically utilized in photolithographic processing known in the PCB art. In such a process, resist is bonded to the designated substrate (here, layer 15), following which light is shined through the mask to expose selected parts of the resist, which are to either remain or be removed, depending on the type of resist (positive or negative) used. Following this exposure step, the structure with resist layer thereon is then exposed to an aqueous developer solution which "develops out" (removes) the undesired parts of the resist. A baking operation then typically follows to "bake" the remaining resist elements, shown in FIG. 2 as numbers 17' and 17". As mentioned above, more than the two resist elements shown may be formed using the teachings herein, depending on the number of optical paths desired for the final substrate product. The invention is not limited to those shown. With the resist elements 17' and 17" formed, it is now possible to complete the patterning of underlying conductive layer 15.

Figure 3:
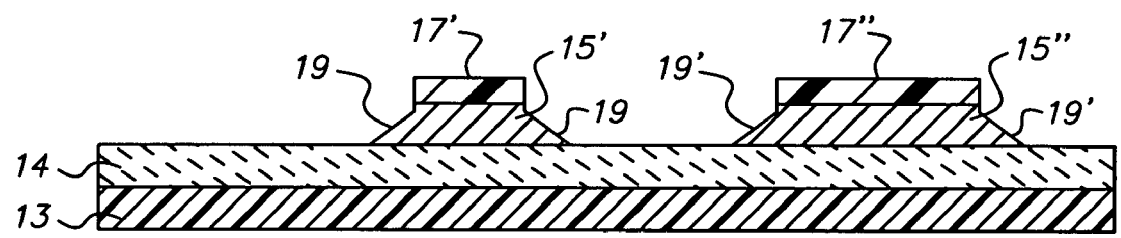

The next step as shown in FIG. 3 involves the etching of uncovered (by resist) portions of layer 15. This is preferably accomplished using gray level (scale) etching using a conventional etchant such as cupric chloride. In such gray level etching, the desired forty-five degree side wall characteristic can be achieved by practicing precise control of exposure level of the protective resist during standard lithography step, using etchant with accurate concentration and exact etching time intervals. Another common method that can be used to achieve forty-five degree side wall control is to use additive copper plating processes. The result of this etching or additive plating is the formation of two upstanding members 15' and 15", each having a pair of opposed angular surfaces 19 and 19', respectively, each surface forming an angle of about forty-five degrees relative to the upper surface of underlying cladding layer 14. In one embodiment, each upstanding member is preferably of substantially rectangular configuration when viewed from above, such that each member includes only two opposing "working" sides with such angular surfaces. Each also will include two opposing ends, each also possibly having an angular surface, but, in the embodiments shown herein, these will not typically be used as part of a reflecting process such as associated with angular surfaces 19 and 19'. It is possible, however, in the broader aspects of this invention to use one or both of such ends (i.e., one facing the viewer in each member shown in FIG. 3) if more reflectance is desired (and more optical pathways used as well). Such added angular surfaces will also be formed concurrently with the formation of surfaces 19 and 19'. Each surface, if members 15' and 15" are of rectangular shape when viewed from above, may have a length (dimension into the drawing) of about five mils. As part of this patterning of conductive layer 15, the layer may also be provided with a plurality of signal lines and/or pads, not shown, oriented in a pre-established circuit pattern, a procedure also referred to in the art as circuitizing. It should also be added that each of the upstanding members may function as a part of any circuit, e.g., as a signal pad or line.

Figure 4:
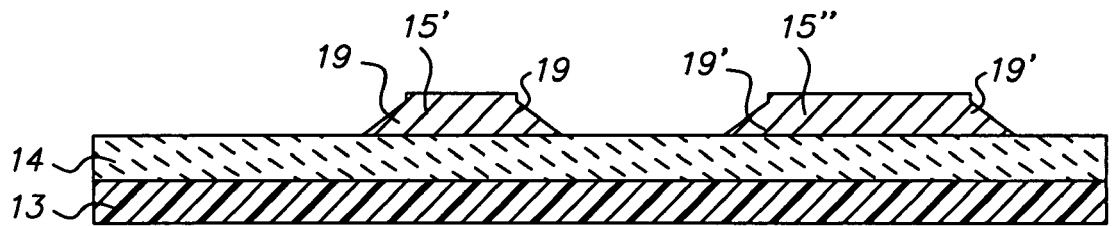
Figure 5:
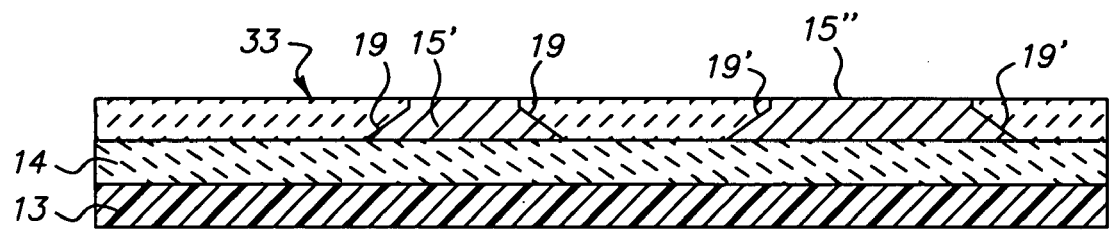

In FIG. 4, the remaining resist segments 17' and 17" have been removed (preferably using developers such as aqueous potassium or sodium carbonate and resist strippers such as aqueous potassium or sodium hydroxide or semi-aqueous PGMEA or S1100X), leaving only the upstanding members 15' and 15" atop layer 14. The next step, shown in FIG. 5, is to deposit a layer of optical core material, which will serve as an optical core 33 for this invention. Optical core 33 is of a highly conductive (optically) material such as one of those defined above (e.g., siloxane), and, in one embodiment, possesses a refractive index of 1.42, higher than that of the underlying cladding layer 14 on which it is formed. Understandably, the material of layer 33 is different, at least optically, than that of layer 14. By way of example, the cladding layer may include one of the aforementioned dopants while the optical core will not. It is also to be understood that the cladding layer and the optical core may have a width dimension less than that of the corresponding supporting layer 13. For example, optical core 33 may possess a width approximately the same as the length (longest dimension) of the respective adjacent surface 19 (or 19') of the upstanding member against which it abuts. It is also understood that in the embodiment defined herein, the optical core layer 33 will be formed with end portions contiguous both opposite angular surfaces 19 and 19'. Optical core layer 33 is applied in liquid form using a spin coating process in which a uniform film of suitable material is deposited onto the surface of layer 14 (cladding layer). Optical core layer 33 may have a resulting thickness of from about one mil to about 2.5 mils, which is substantially the same as the corresponding thickness of under layer (optical core) 33.

Figure 6:
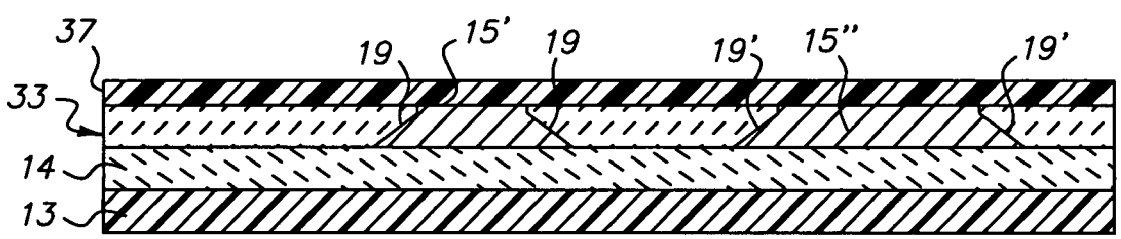

In FIG. 6, a layer of photo-resist 37 is positioned atop the layered sub-composite of FIG. 5, preferably also using conventional PCB lamination as was used for resist layer 17 in FIG. 1, e.g., at a pressure of from about 2.5 PSI to about forty-five PSI, at a temperature of from about twenty-five degrees C. to about forty-five degrees C., for a time period of about one minute to about 2.5 minutes. Resist 37 may have a thickness of only about one mil to about 2.5 mils and is preferably of the same material as used for layer 17. Alternative compositions, many of which are known in the art, may be used.

Figure 7:
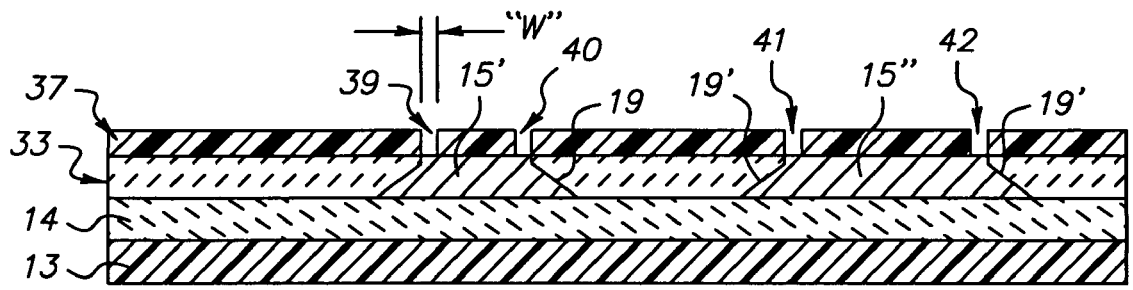

In FIG. 7, photo-resist layer 37 is patterned, which, according to one embodiment, may be accomplished using a similar photolithography process used for layer 17. As stated, this process involves using a master (not shown) and conventional exposure processing. In this case, the bonded resist and adjacent master are exposed to light which is shined through the master to expose selected parts of the resist, which are to either remain or be removed, depending on the type of resist (positive or negative) used. Following this exposure step, the structure with resist layer thereon is then exposed to an aqueous developer solution which "develops out" (removes) the undesired parts of the resist. A baking operation then typically follows to "bake" the remaining resist elements. In this particular embodiment, a plurality of openings 39, 40, 41 and 42 are formed in the resist, each above an end portion of an underlying upstanding member. For example, opening 39 is above the end portion to the left of underlying member 15', opening 40 above the right side end portion of member 15', etc. Each of the openings 39-42 is of the same length (dimension into the drawing) as the corresponding angular surface (i.e., opening 39 relative to the angular surface 19 on the left of member 15'), such that each opening is also of substantially rectangular shape when viewed from above. In one example, each opening 39-42 may have a width (dimension "W" in FIG. 7 for opening 39) of about five mils. As understood, more than the four openings shown may be formed using the teachings herein, depending on the number of underlying upstanding members. The invention is thus not limited to the number shown. It is also possible using the teachings herein to form openings 39-42 using a laser, one example being Carbon Dioxide Laser. Such lasers are often used in forming openings in various PCB materials, such as in the formation of thru-holes such as blind vias or plated through holes (PTHs). Further description is not believed necessary. With the openings 39-42 formed, it is now possible to begin removing selected portions of both the underlying members 15' and 15".

Figure 8:
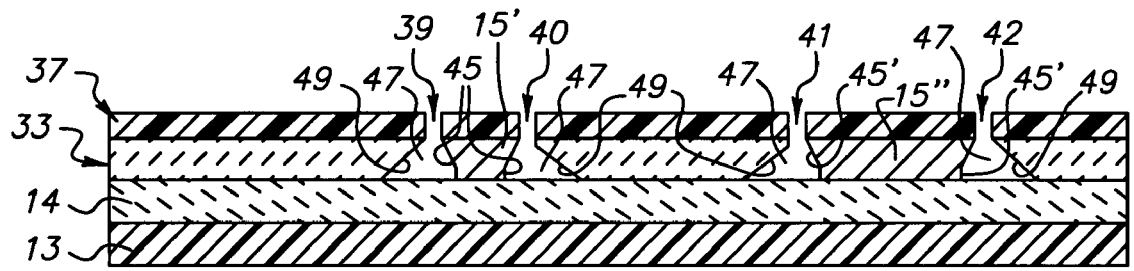

Such removal is shown in FIG. 8, and is accomplished in one aspect of the invention using etchant which is either sprayed onto the upper part of the FIG. 7 structure or this structure is immersed in a solution of such etchant. As in the case for layer 15 in FIG. 2, a preferred etchant is cupric chloride. Other etchants which may be used include ferric chloride and persulfate.

In this process, the forty-five degree angle copper is partially etched away to form openings between the copper and the optical waveguides. As shown, only the conductive (e.g., copper) members 15' and 15" are etched away, the etchant not adversely affecting the optical core material. Significantly, the etching process results in the formation of pairs of offsetting angular sides 45 and 45' on members 15' and 15", respectively. Each of these angular sides is formed at an angle of about forty-five degrees, or substantially similar to the angle of the nearest adjacent angled surface of the optical core 33. The result is the formation of substantially tapered openings 47 between the sides of the upstanding members and adjacent optical core material, such that the core will also include angular sidewalls 49, a very important feature of this invention. As shown, these sidewalls are at an angle of about forty-five degrees relative to the underlying surface of cladding layer 14.

Figure 9:
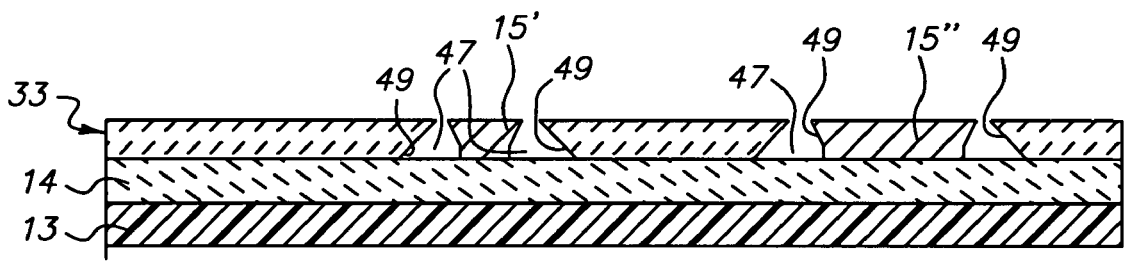
Figure 10:
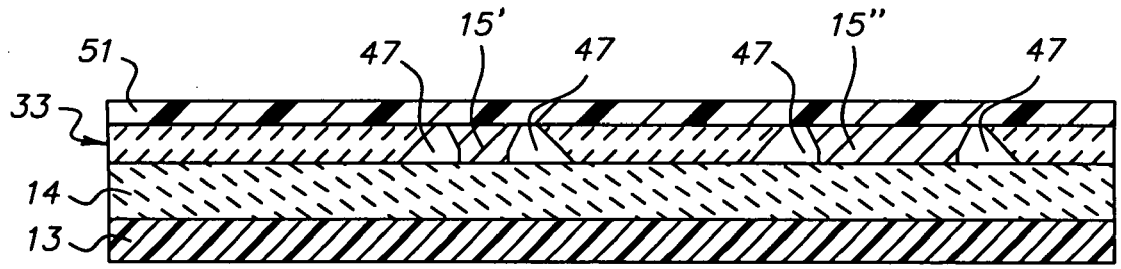
Figure 11:
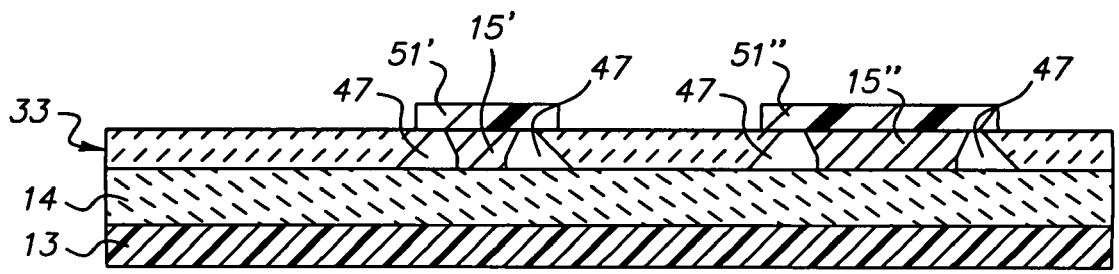

In FIG. 9, the remainder of resist 37 is removed, preferably in a similar manner used for removal of resist 17 (FIG. 4), and, in FIG. 10, yet another layer of photo-resist 51 is applied. Layer 51, like layers 17 and 37, is preferably applied using conventional PCB lamination, e.g., at a pressure of from about one PSI to about twenty-five PSI, at a temperature of from about twenty-five degrees C. to about forty-five degrees C., for a time period of about one minute to about three minutes. Resist 51 may have a thickness of only about one mil to about 2.5 mils and is preferably of the same material used for layer 17 and/or layer 37. Alternative compositions, many of which are known in the art, may be used. Significantly, resist 51 covers optical core 33, upstanding members 15' and 15" and openings 47, thus "tenting" over these openings. The layer of resist 51 is now patterned, preferably using a similar photolithography process as used for layers 17 and 37. The result is the formation of two resist segments 51' and 51" (FIG. 11), each of these covering a respective pair of openings (i.e., 47) adjacent an underlying upstanding member (i.e., 15'). Segments 51' and 51" thus "tent" across both pairs of openings 47, while fully covering the corresponding upper surfaces of both upstanding members. Such "tenting" is possible despite the relatively small portion of the adjacent optical core 33 on which the ends of each segment are positioned.

As mentioned, the steps defined hereinabove may be common to at least a subsequent series of steps designed to produce a circuitized substrate as defined herein. The first of these subsequent series will be defined below with respect to FIGS. 12-14 and the second with respect to FIGS. 15-18.

Figure 12:
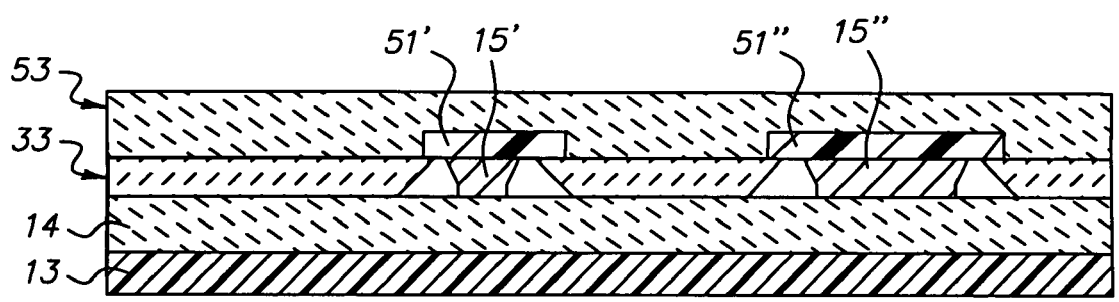
FIGS. 12-14 illustrate a series of subsequent steps which may follow those shown in FIGS. 1-11 to produce a circuitized substrate according to one embodiment of the invention.
Figure 13:
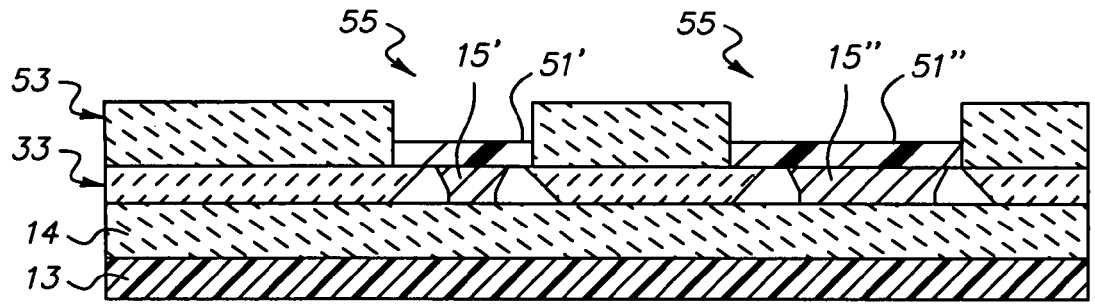
Figure 14:
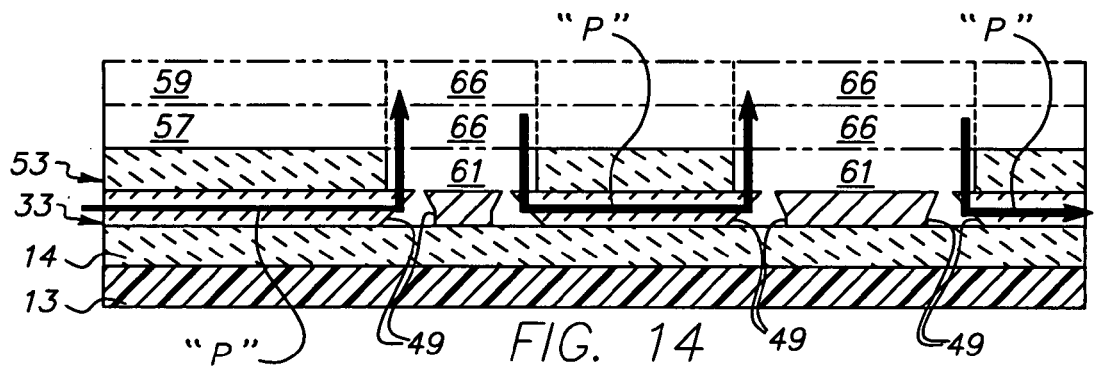
Figure 15:
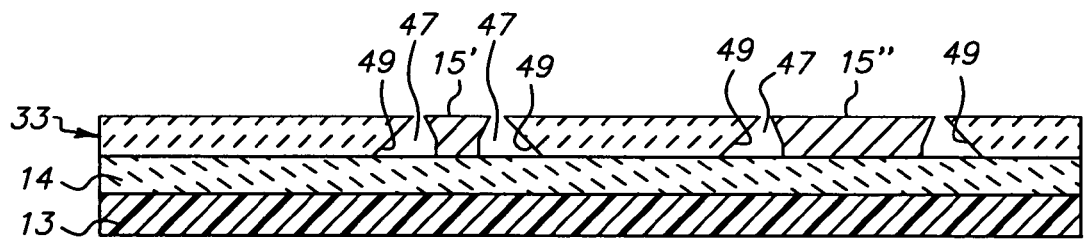
FIGS. 15-18 illustrate another series of subsequent steps which may follow those shown in FIGS. 1-11 to produce a circuitized substrate according to a second embodiment of the invention.
Figure 16:
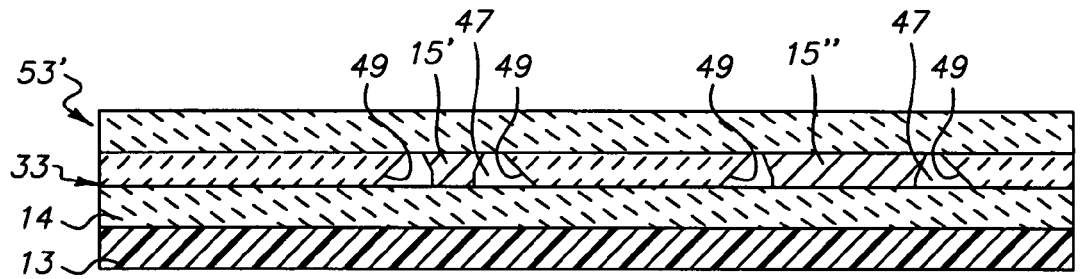

The series of steps shown in FIGS. 12-14 are what might be referred to as the "liquid" cladding application steps because these involve the initial application of a second cladding layer 53 in liquid form. The material for this second cladding layer may be the same as that of the first cladding layer 33, and will have a similar refractive index. A conventional spin coating process used to apply uniform thin films on flat substrates may be utilized here. In short, an excess amount of the liquid cladding is placed on the optical core 33 and remaining resist segments 51' and 51". The structure is then rotated at high speed in order to spread the liquid cladding material by centrifugal force. Rotation is continued while the liquid spins off the edges of the substrate, until the desired thickness of the film is achieved. The remaining material is then hardened, such as by a combined UV and thermal curing processes. In one example, layer 53 may possess a thickness of two to three mils. The substrate now includes at least one optical pathway defined by an interim optical core 33 and adjacent and surrounding cladding layers 14 and 53. It is understood that the liquid cladding layer, when applied, covers not only the top of the optical core 33 as shown in FIG. 12 but also the adjacent sides (to the front of the core and behind same in FIG. 12). The core is thus fully surrounded by cladding.

In FIG. 13, the now hardened cladding material of layer 53 is now patterned to provide openings 55 directly above the respective segments 51' and 51" of resist 51. Such patterning may be accomplished using conventional photolithography processing (e.g., master alignment, exposure, etc.) and subsequent cladding material removal using conventional etchant (e.g., cupric chloride). Alternatively, openings 55 may be provided using a laser, similar to the one used above (if so used) for forming openings 39-42. In FIG. 14, the resist segments are removed and the substrate ready for further application of additional layer(s) if such layers are desired as in the case of a multilayered circuitized substrate having several conductive layers and corresponding dielectric layers. These added layers (which may be referred to simply as covering layers) are added atop the patterned cladding layer 53, e.g., using conventional PCB lamination processing. Understandably, the greater number of such layers will produce a final multilayered circuitized substrate having greater operational capabilities. These layers, shown in phantom and represented by numerals 57 and 59, may be conductive and dielectric layers, respectively. Layer 59, if a dielectric, may be of similar dielectric material as initial layer 13. Layer 57, being conductive, may also be circuitized such as by using photolithographic processing defined above. More than two layers may also be provided, again depending on the operational electrical requirements for the final product. In one embodiment, it may be possible to add as many as thirty or more additional conductive and dielectric layers. Layers 57 and 59 may be of conventional PCB layer thicknesses or of other acceptable thicknesses if desired. It is also within the scope of this invention to add at least one additional covering layer and not of a material such as those defined above. Such a layer, or layers if more than one is desired, will function to cover and thus protect the underlying optical pathway structure (cladding-core-cladding) which forms part of the final circuitized substrate.

Before the addition of layers 57 and 59, it is also possible to fill each of the openings 55 with optically transmissible (transparent) material 61 (in phantom). Such material may be the same as that for the optical core layer 33. In one example, this material may be Siloxane, and is applied by inkjet or screen printing method. It is also important, when added layers such as layers 57 and 59 are provided, to form an opening 66 (in phantom) in both layers which align directly above the underlying openings 55 (now including material 61 therein). Such opening formation is preferably accomplished using a laser, and preferably the same laser used to form other openings defined herein. As shown, the laser effectively ablates both the dielectric material and the underlying conductive material in these layers, exposing the transparent optical material 61. In one embodiment, each of these openings 66 is of the same shape (when viewed from above) and dimensions as the underlying opening 55.

The structure of FIG. 14 (with added reference to FIG. 18 for ease of explanation), referable to as a circuitized substrate and now having at least one optical pathway internally thereof (at least three pathways "P" are shown in FIG. 14), is now ready for operation when coupled to appropriate other components. One example of such added components may be optoelectronic modules mounted on added circuitized substrates, such as represented by the numbers 65 and 67 for the embodiment in FIG. 18, to produce an electro-optical assembly 71. Substrates 65 and 67 may be "daughter cards" while the substrate produced according to the teachings herein may represent a "motherboard" adapted for having such cards and other components positioned thereon and coupled thereto. If so, both of the secondary substrates may be electrically coupled such as by using electrical connectors 73 and 75, respectively (shown in phantom in FIG. 18). Such electrical connectors typically include a plurality of contacts therein designed to mate with corresponding conductive pathways on the incoming substrate's outer surface, these contacts in turn coupled to various internal conductors such as pins which project from the connector's body (housing) and fit within corresponding receiving openings within the hosting substrate. Such means of electrically coupling two substrates are very well known in the art and further description is not considered necessary. Accordingly, the aforementioned contacts, pins and receiving openings are not shown in FIG. 18.

In the case of the "mother" substrate of the invention and the mounted substrates 65 and 67, these three are also coupled in an optical manner, with optical data signals passing through (along the optical paths "P") the optical core of the lower substrate and reflecting off the substrate's uniquely formed angular sidewalls 49 as shown. Such data signals may pass from the mother substrate to one or more of the upper substrates as well as pass from the substrates back into the mother substrate. In the case of signals passing along the central pathway "P" in FIG. 14 (and FIG. 18), the optical signals may pass from one upper substrate to the mother substrate and back into the other (here, adjacent) upper substrate. Other combinations are of course readily possible. If modules are used, such as those represented by the number 81 in FIG. 18, each may include a light-emitting diode or laser for emitting processed electrical signals within the substrate which couples to the module. Typically, a complete optoelectronic device of this type includes a die (semiconductor) which comprises an emitter, a header for providing mechanical support to the emitter, a lens for focusing light output generated by the LED or laser, and suitable electrical connections. It may function as a transmitter of optical data signals and/or receiver of same. If the latter, it will include a serializer for serializing received data, as well as means for converting such optical signals to electrical such that the resulting electrical signals may then pass to other sections of the hosting substrate and then perhaps to other equipment to which the substrate is operationally connected. Such optoelectronic devices, and the means of connecting same, are known in the art and further definition is not considered necessary. As seen in FIG. 18, one such module 81 (to the left of substrate 65) is adapted for receiving optical data signals while the other module 81 (to the right on substrate 65) provides optical signals down to the hosting mother substrate (and then back up into the adjacent substrate 67). The modules on substrate 67 provide similar functions, albeit in a reverse manner compared to those of substrate 65. Other such modules (not shown) may be used to transmit optical signals to and receive such signals from one or more of the substrates shown. Understandably, the invention is not limited to using only these types of transmitters and receivers as others are possible.

The series of steps shown in FIGS. 15-18 are what might be referred to as the "film" cladding application steps because these involve the application of a second cladding layer 53' (FIG. 16) in the form of a thin film layer of the desired cladding material. The material for this second cladding layer may be the same as that of other cladding layers defined herein, and will have a similar refractive index. A conventional PCB lamination process may be used to bond the second layer 53' to the upper surfaces of the underlying optical core and both upstanding members. As with the liquid cladding, the relatively more rigid thin film layer 53'"tents" across the openings 47 formed in the manner defined above between the optical core and adjacent upstanding members. In one embodiment, lamination of layer 53' may be accomplished at a pressure of from about two PSI to about thirty PSI, a temperature of from about twenty-five degrees C. to about forty-five degrees C., and for a time period of about one minute to about four minutes. The resulting layer 53' may have a thickness of only about 1.5 mils to about three mils. The result of this is the structure shown in FIG. 16, having started from a structure shown in FIG. 15 (similar to FIG. 9), following removal of the remaining resist segments (not shown in FIG. 15).

Layer 53' also possesses the same refractive index (e.g., 1.40) as layer 14. Because it is essential that optical core layer 33 be completely surrounded by cladding material, layer 53' is applied at a width greater than the corresponding width of the underlying core 33, such that it will surround the top and both sides thereof, as occurred for layer 53. That is, because core layer 33 is preferably of substantially rectangular cross-section, the second cladding layer needs to be bonded to the upper planar surface of the core and also to both opposing upstanding sides. Understandably, the remaining underside of the core is bonded to the underlying first cladding layer 14. The present invention thus assures that the core will be effectively surrounded with cladding material.

Figure 17:
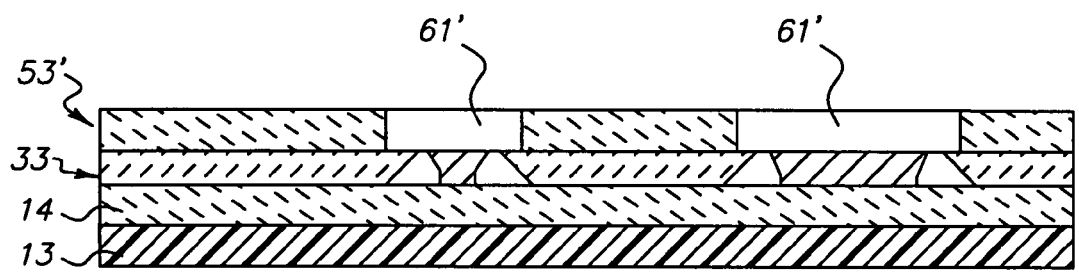
Figure 18:
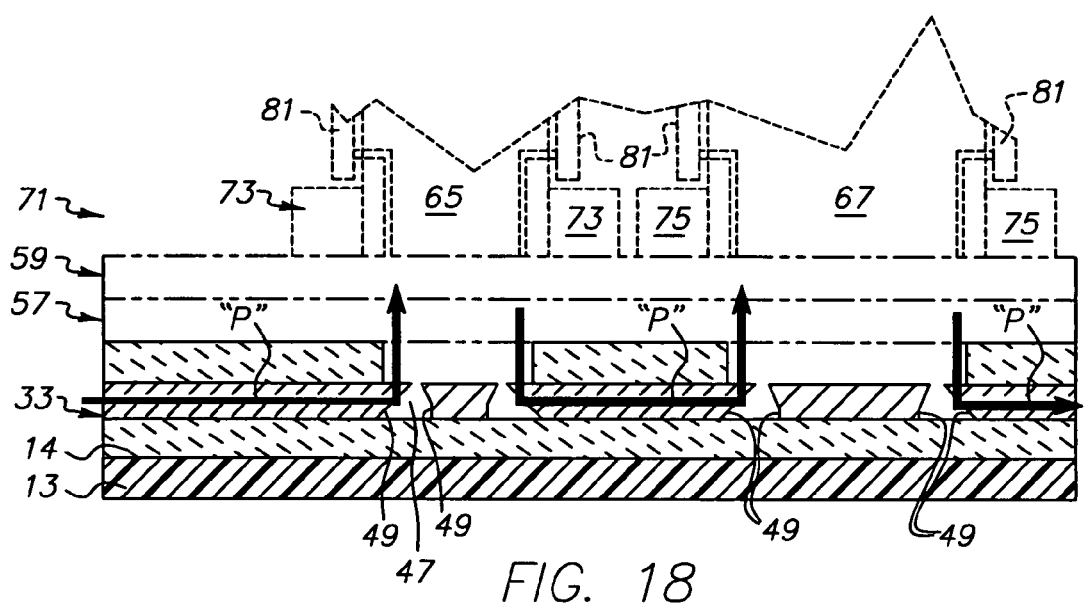

In FIG. 17, openings 61' are formed with the optical cladding layer 53', preferably in the same manner that openings 61 were formed in layer 53 (FIG. 14). Following this step, added layers such as layers 57 and 59 may be added, similarly to the manner layers 57 and 59 are added to the FIG. 14 embodiment. Further definition is not considered necessary. Also, it is possible to fill openings 61' with optically transmissive (transparent) material (not shown) as was possible for openings 61. With added layers 57 and 59 in place, openings such as openings 66 in FIG. 14, are provided through which the optical signals may pass. These openings are now shown in FIG. 18 for ease of explanation. The remaining operation and features of the structure of FIG. 18 are similar to that discussed for the FIG. 14 structure, and additional description is thus not provided.

Thus there has been shown and described a method of making a circuitized substrate having at least one (and possibly several) optical pathways therein such that the substrate may be coupled both electrically and optically in a facile manner to other, similar substrates. The substrate as defined herein may be made using many conventional PCB processes, thereby assuring that the costs of producing the final product are kept to a minimum. As defined, the method does not require the use of a stencil or the like as part of the optical pathway forming process. Instead, it uses conventional photolithography processing including exposure and resist removal to define precise, minute patterns for ultimate definition of the pathway reflectors. Other advantages of the invention have been cited above or are discernible from the teachings herein.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate including at least one optical pathway therein, said method comprising:
   providing a first dielectric layer;
   providing a first cladding layer on said first dielectric layer;
   providing a first electrically conductive layer on said first cladding layer;
   patterning said first electrically conductive layer on said first cladding layer to define at least one upstanding member on said first cladding layer;
   providing a dielectric optical core on said first cladding layer having at least one end portion contiguous said at least one upstanding member, said dielectric optical core adapted for providing an optical pathway for optical signals passing through said dielectric optical core;
   removing a portion of said at least one upstanding member on said first cladding layer to define at least one first opening between said at least one upstanding member and said dielectric optical core, said at least one first opening having at least one angular sidewall to form a 45 degree dielectric-to-air reflector;
   providing a second cladding layer over said dielectric optical core, said at least one first opening and said at least one upstanding member;
   providing at least one covering layer over said second cladding layer to form a circuitized substrate; and
   forming at least one second opening within said at least one covering layer and said second cladding layer relative to said at least one angular sidewall such that optical signals passing through said dielectric optical core will be internally reflected off said at least one angular sidewall and pass through said at least one second opening.

2. The method of claim 1 wherein said patterning of said first electrically conductive layer to define at least one upstanding member on said first cladding layer comprises using photolithographic processing wherein a layer of photo-resist is positioned on said first electrically conductive layer.

3. The method of claim 2 wherein said layer of photo-resist is laminated onto said first electrically conductive layer.

4. The method of claim 2 wherein said patterning of said first electrically conductive layer results in the formation of at least one first angular surface on said at least one upstanding member.

5. The method of claim 4 wherein said removing of said portion of said at least one upstanding member to define at least one first opening further results in the formation of at least one second angular surface on said at least one upstanding member having an angle different than the angle of said at least one first angular surface.

6. The method of claim 1 wherein said providing of said dielectric optical core on said first cladding layer having at least one end portion contiguous said at least one upstanding member is accomplished by depositing the material which comprises said dielectric optical core in liquid form on said first cladding layer.

7. The method of claim 6 wherein said depositing of said material which comprises said dielectric optical core in liquid form is accomplished by spin coating said material onto said first cladding layer.

8. The method of claim 1 wherein said providing of said second cladding layer over said dielectric optical core is accomplished by depositing the material which comprises said second cladding layer in film form.

9. The method of claim 1 wherein said forming of said at least one second opening within said at least one covering layer and said second cladding layer is accomplished using a laser.

10. The method of claim 9 wherein the number of said covering layers is at least two, one of said covering layers being of a dielectric material and another of said covering layers being of an electrically conductive material.

11. The method of claim 1 further including positioning a quantity of optically-transmitting material within said opening.

12. The method of claim 1 further including positioning a second circuitized substrate having at least one dielectric optical core as part thereof relative to said at least one second opening within said at least one covering layer and said second cladding layer such that said dielectric optical core of said second circuitized substrate is adapted for receiving and/or transmitting optical signals from and/or to said first circuitized substrate, respectively, through said at least one second opening, said first and second circuitized substrates forming an electro-optical assembly.

13. The method of claim 12 wherein said first and/or second circuitized substrate includes at least one optical transmitter and/or optical receiver thereon.

* * * * *